(12) United States Patent
Kasai

(10) Patent No.: US 10,468,094 B2
(45) Date of Patent: Nov. 5, 2019

(54) SEMICONDUCTOR MEMORY DEVICE

(71) Applicant: TOSHIBA MEMORY CORPORATION, Minato-ku, Tokyo (JP)

(72) Inventor: Hayao Kasai, Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/891,351

(22) Filed: Feb. 7, 2018

(65) Prior Publication Data
US 2019/0080744 A1    Mar. 14, 2019

(30) Foreign Application Priority Data

Sep. 14, 2017  (JP) ................................. 2017-176904

(51) Int. Cl.
| G11C 11/00 | (2006.01) |
| G11C 16/04 | (2006.01) |
| G11C 11/4094 | (2006.01) |
| G11C 16/34 | (2006.01) |
| G11C 11/56 | (2006.01) |
| G11C 16/10 | (2006.01) |
| G11C 29/26 | (2006.01) |
| G11C 29/52 | (2006.01) |

(Continued)

(52) U.S. Cl.
CPC ...... *G11C 11/4094* (2013.01); *G11C 11/5628* (2013.01); *G11C 11/5635* (2013.01); *G11C 16/0475* (2013.01); *G11C 16/10* (2013.01); *G11C 16/3445* (2013.01); *G11C 16/3459* (2013.01); *G11C 29/26* (2013.01); *G11C 29/52* (2013.01); *G11C 7/12* (2013.01); *G11C 16/0483* (2013.01); *G11C 16/32* (2013.01); *G11C 2029/1204* (2013.01); *G11C 2029/2602* (2013.01); *G11C 2211/5624* (2013.01); *G11C 2211/5641* (2013.01); *G11C 2216/22* (2013.01)

(58) Field of Classification Search
CPC . G11C 16/0483; G11C 13/0069; G11C 16/10; G11C 8/10; G11C 16/26; G11C 8/12; G11C 16/08; G11C 29/38; G11C 13/0028; G11C 11/413; G11C 7/22; G11C 8/06; G11C 8/08; G11C 8/14; G11C 11/419
See application file for complete search history.

(56) References Cited

U.S. PATENT DOCUMENTS

2007/0025151 A1* 2/2007 Lee .................. G11C 11/5621
                                                   365/185.11
2008/0285343 A1 11/2008 Park et al.
(Continued)

FOREIGN PATENT DOCUMENTS

| JP | 59098393 A | 6/1984 |
| JP | 2003178590 A | 6/2003 |

(Continued)

*Primary Examiner* — Hien N Nguyen
(74) *Attorney, Agent, or Firm* — Holtz, Holtz & Volek PC

(57) ABSTRACT

According to one embodiment, a semiconductor memory device comprises a first memory cell array including a first block and a second block, the first block including a first memory cell, and the second block including a second memory cell; and a controller that performs, in a first period of time in writing, a first program in the first memory cell and the second memory cell.

8 Claims, 9 Drawing Sheets

(51) Int. Cl.
 *G11C 7/12* (2006.01)
 *G11C 16/32* (2006.01)
 *G11C 29/12* (2006.01)

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2015/0255161 A1* | 9/2015 | Lee .................. G11C 16/16 365/185.12 |
| 2018/0102172 A1* | 4/2018 | Yi ..................... G11C 8/12 |

FOREIGN PATENT DOCUMENTS

| | | |
|---|---|---|
| JP | 2008282521 A | 11/2008 |
| JP | 2012069185 A | 4/2012 |

* cited by examiner

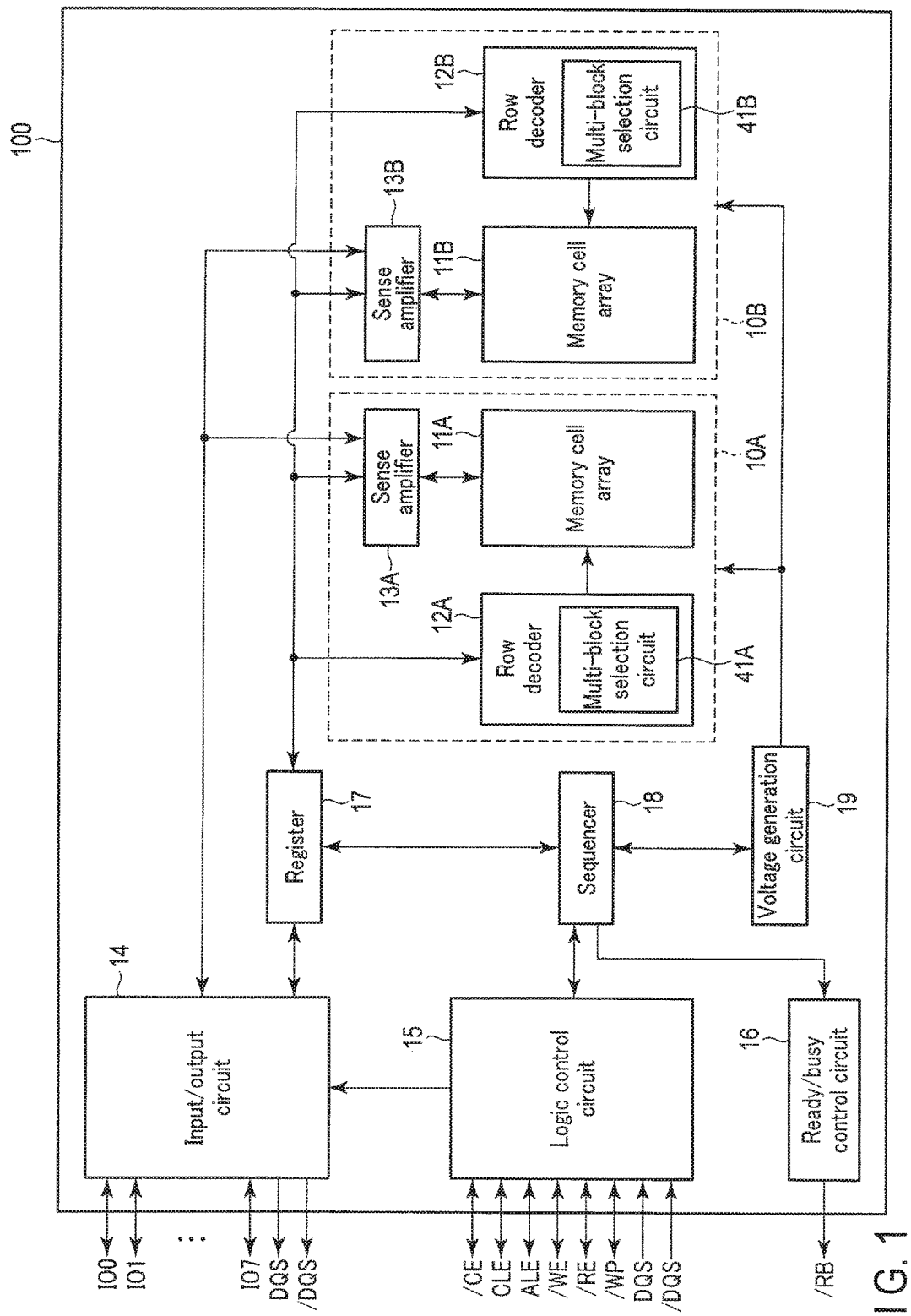
F I G. 1

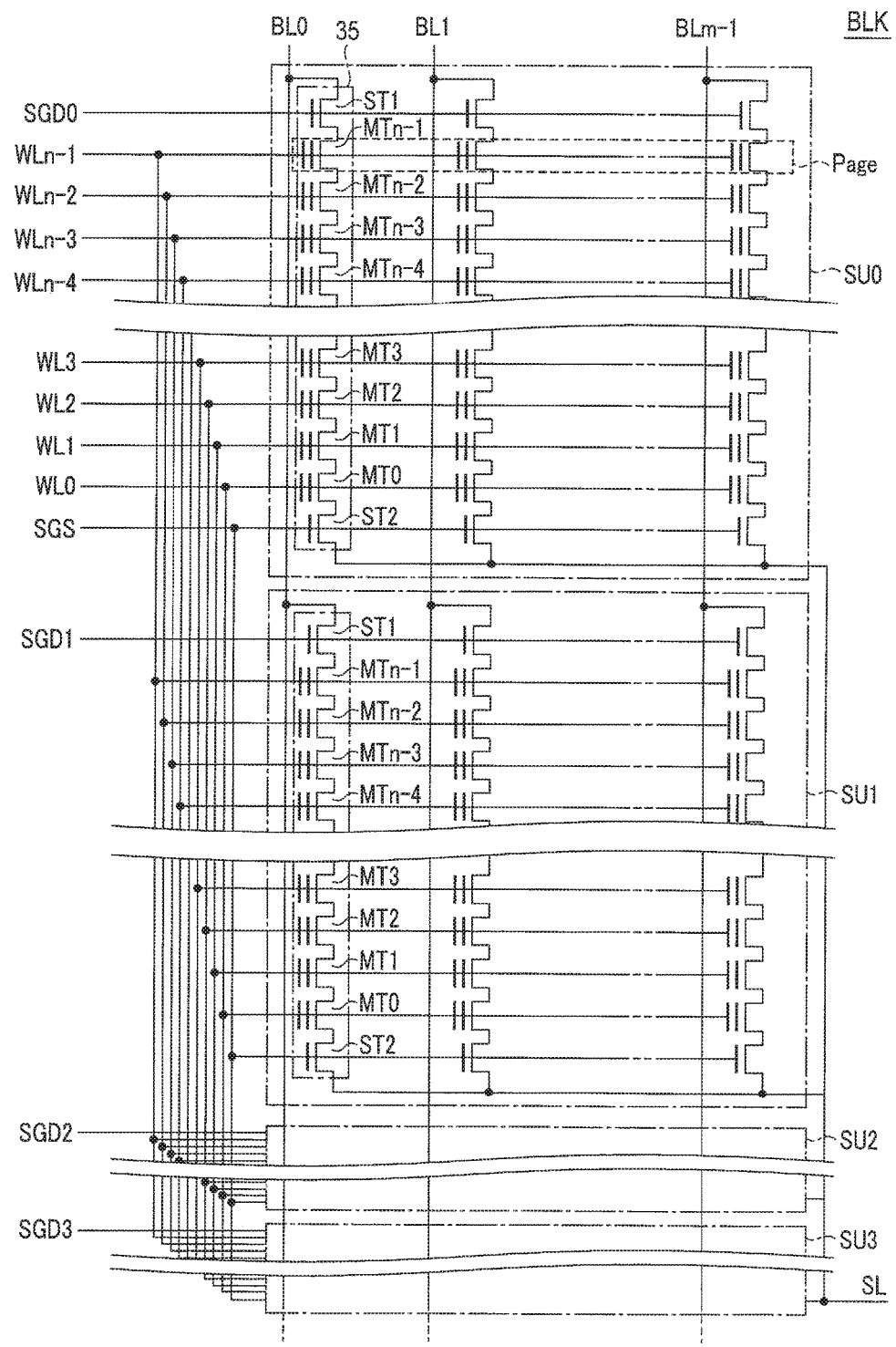
F I G. 3

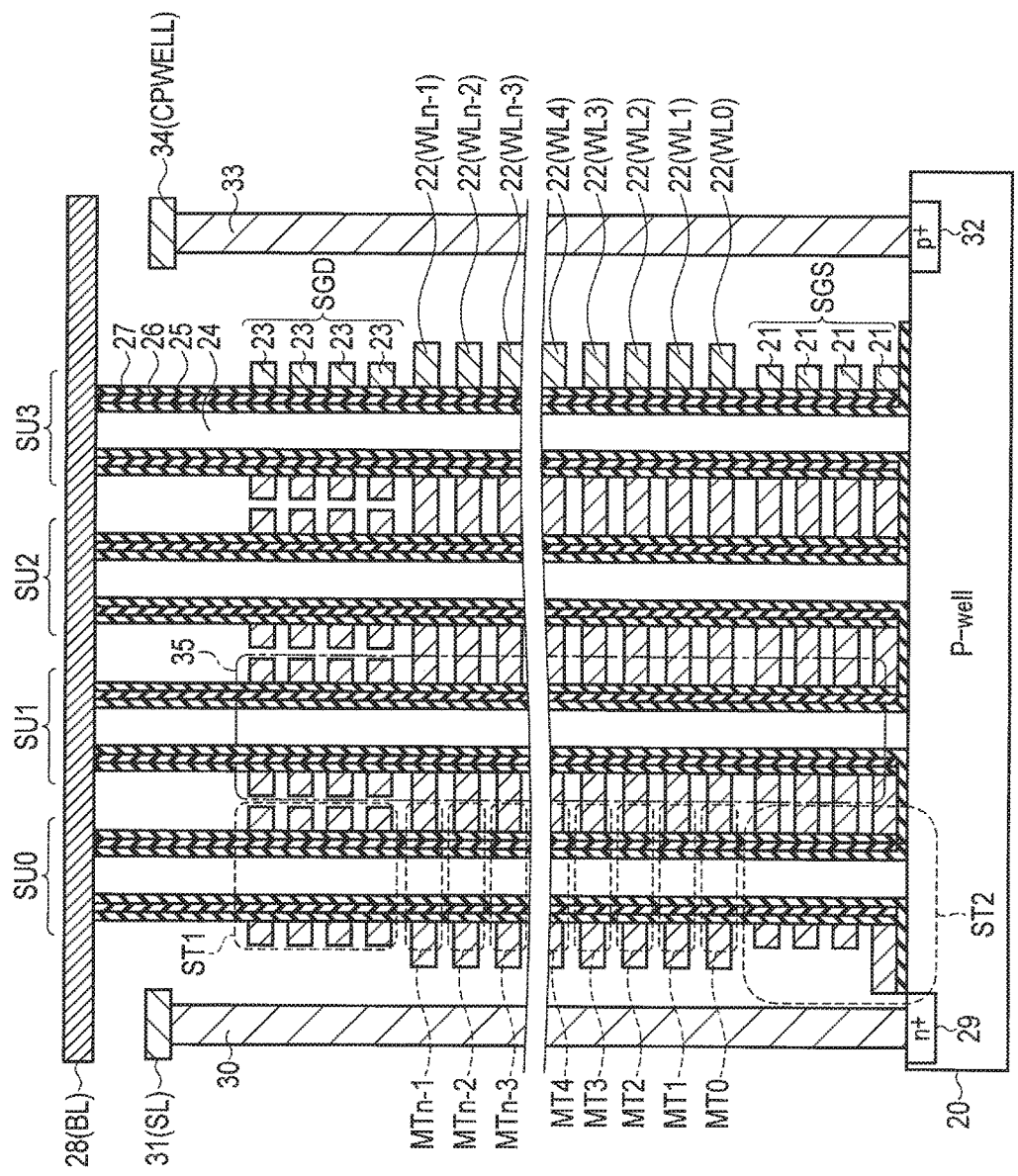
F I G. 4

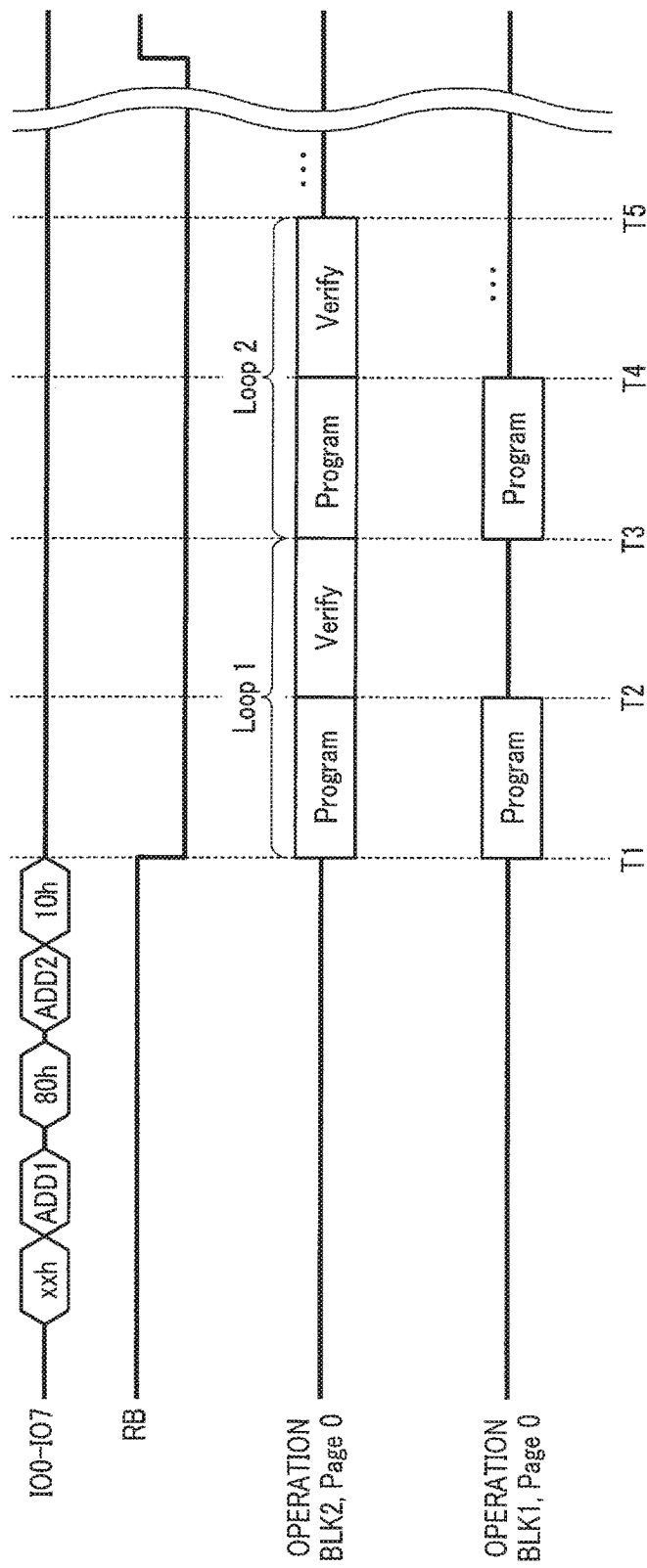
F I G. 6

SEMICONDUCTOR MEMORY DEVICE

CROSS-REFERENCE TO RELATED APPLICATIONS

This application is based upon and claims the benefit of priority from the prior Japanese Patent Application No. 2017-176904, filed Sep. 14, 2017, the entire contents of which are incorporated herein by reference.

FIELD

Embodiments described herein relate generally to semiconductor memory devices.

BACKGROUND

As semiconductor memory devices, NAND flash memories have been known.

BRIEF DESCRIPTION OF THE DRAWING

FIG. 1 is a diagram showing a semiconductor memory device according to an embodiment of the present application;

FIG. 3 is a circuit diagram showing blocks in the semiconductor memory device according to the embodiment;

FIG. 4 is a cross-sectional diagram showing blocks in the semiconductor memory device according to the embodiment;

FIG. 6 is a diagram showing a command sequence of writing in a test mode in the semiconductor memory device according to the embodiment;

DETAILED DESCRIPTION

Figure 2:
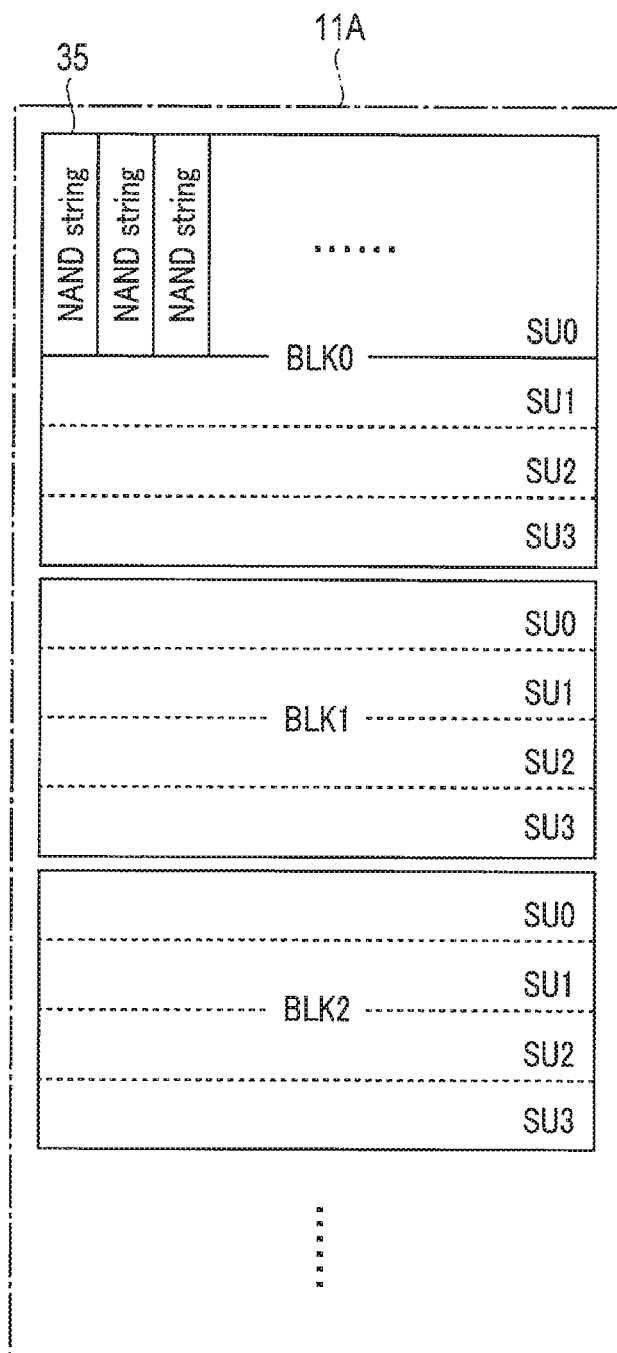
FIG. 2 is a diagram showing a memory cell array in the semiconductor memory device according to the embodiment.

In general, according to one embodiment, a semiconductor memory device includes a first memory cell array including a first block and a second block, the first block including a first memory cell, and the second block including a second memory cell; and a controller that performs, in a first period of time in writing, a first program in the first memory cell and the second memory cell.

The embodiment will be explained below, in reference to the drawings. In the drawings, the same parts are provided with the same reference signs.

Embodiment

A semiconductor memory device according to the embodiment will be explained using FIGS. 1 to 9. In the following, as a semiconductor memory device, a three-dimensionally stacked NAND flash memory will be explained, in which memory cells (memory cell transistors) are three-dimensionally stacked on a semiconductor substrate. In the following explanations, "coupling" encompasses not only a case of being directly coupled but also a case of being coupled via an optional element. A first terminal of a transistor indicates one of a source or a drain, and a second terminal of the transistor indicates the other of the source or the drain. A control terminal of the transistor indicates a gate.

1. Configuration Example in Embodiment

FIG. 1 is a diagram showing a semiconductor memory device 100 according to one embodiment.

As shown in FIG. 1, the semiconductor memory device 100 comprises planes 10A, 10B, an input/output circuit 14, a logic control circuit 15, a ready/busy control circuit 16, a register 17, a sequencer 18, and a voltage generation circuit 19.

The input/output circuit 14 transmits and receives a signal IO (IO0 to IO7) from the outside (a host or memory controller) of the semiconductor memory device 100. The signal IO includes a command, an address, data, etc. The input/output circuit 14 transmits a command and an address received from the outside to the register 17. The input/output circuit 14 transmits writing data received from the outside to a sense amplifier 13 (13A, 13B), and transmits reading data received from the sense amplifier 13 to the outside. The input/output circuit 14 transmits a data strobe signal DQS/DQS along with the reading data to the outside. The reading data is read out in synchronization with the signal DQS/DQS.

The logic control circuit 15 receives various control signals from the outside to control the input/output circuit 14 and the sequencer 18. As the control signals, a chip enable signal/CE, a command latch enable signal CLE, an address latch enable signal ALE, a write enable signal/WE, a read enable signal/RE, a write protect signal/WP, and a data strobe signal DQS/DQS are used, for example. The signal/CE makes the semiconductor memory device 100 (semiconductor chip) enabled. The signals CLE and ALE respectively inform the input/output circuit 14 that the signal IO is a command and an address. The signal/WE instructs the input/output circuit 14 to input the signal IO. The signal/RE instructs the input/output circuit 14 to output the signal IO. The signal/WP makes the semiconductor memory device 100 in a protected state, for example, when the power source is turned on or off. The signal DQS/DQS is received together with the writing data. The writing data is written in synchronization with the signal DQS/DQS.

The ready/busy control circuit 16 transmits a signal/RB to the outside to inform the outside of a state of the semiconductor memory device 100. The signal/RB indicates whether the semiconductor memory device 100 is in a ready state (a state where an instruction from the outside is acceptable) or in a busy state (a state where an instruction from the outside is not acceptable).

The register 17 maintains commands and addresses. The register 17 transmits an address to a row decoder 12 (12A, 12B) and a sense amplifier 13 (13A, 13B), and transmits a command to the sequencer 18. The register 17 maintains various tables for controlling a sequence executed based on the command.

The sequencer (controller) 18 receives a command and refers to various tables in the register 17. The sequencer 18 controls the entirety of the semiconductor memory device 100 in accordance with information presented in the various tables.

The voltage generation circuit 19 includes various drivers. The voltage generation circuit 19 generates a voltage necessary for an operation, such as writing, reading, erasing of data, etc. The voltage generation circuit 19 supplies the generated voltage to the row decoder 12 and the sense amplifier 13.

A plane 10A includes a memory cell array 11A, a row decoder 12A, and a sense amplifier 13A. A plane 10B has the same configuration as the plane 10A, and includes a memory cell array 11B, a row decoder 12B, and a sense amplifier 13B. For example, writing and reading can be performed concurrently (in parallel) in each of the planes. The number of planes is not limited to two, and may be three or more. In the following, the plane 10A will be mainly explained.

The row decoder 12A receives a row address (including a block address and a page address) from the register 17, and selects a block BLK and a word line WL in the memory cell array 11A based on the row address. The row decoder 12A supplies a voltage from the voltage generation circuit 19 to the selected word line WL.

The row decoder 12A includes a multi-block selection circuit 41A. The multi-block selection circuit 41A selects, for example, in writing in a test mode, a plurality of discretionary blocks BLK and a discretionary singular block BLK of the plurality of discretionary blocks in the memory cell array 11A, based on the row address. The row decoder 12B in the plane 10B similarly includes a multi-block selection circuit 41B. Hereinbelow, if the multi-block selection circuits 41A and 41B are not differentiated from one another, the multi-bock selection circuit is called a multi-block selection circuit 41.

The sense amplifier 13A supplies a voltage from the voltage generation circuit 10 to the bit line BL to thereby read data in a memory cell via the bit line BL in the memory cell array 11A, and writes data in a memory cell in the memory cell array 11A via the bit line BL. The sense amplifier 13A includes an unillustrated data latch, and the data latch temporarily stores writing data and reading data. The sense amplifier 13A receives a column address from the register 17, and outputs data of the data latch to the input/output circuit 14, based on the column address.

FIG. 2 is a diagram showing a memory cell array in the semiconductor memory device 100 according to the embodiment.

As shown in FIG. 2, the memory cell array 11A includes a plurality of blocks BLK (BLK0, BLK1, BLK2 . . . ). The block BLK includes, for example, four string units SU (SU0-SU3). The string unit SU includes a plurality of NAND strings 35. The number of blocks in the memory cell array 11A and the number of string units in a block are arbitrary.

FIG. 3 is a circuit diagram showing a block BLK in the semiconductor memory device 100 according to the embodiment.

As shown in FIG. 3, the NAND string 35 comprises n memory cell transistors MT (MT0 to MTn−1), and selection transistors ST1 and ST2. The memory cell transistors MT each comprise a control gate and a charge storage layer, and maintain 1 bit or more data in a nonvolatile manner. The memory cell transistors MT are correlated with rows and columns. The memory cell transistors MT are coupled in series between a first terminal of the selection transistor ST1 and a first terminal of the selection transistor ST2.

Control terminals of the selection transistors ST1 in string units SU0 to SU3 are respectively coupled to selection gate lines SGD0 to SGS3. In contrast, control terminals of the selection transistors ST2 in the string units SU0 to SU3 are coupled, for example, commonly to a selection gate line SGS; however, they may be coupled to different selection gate lines of SGS0 to SGS3 on a string unit basis. Control terminals of the memory cell transistors MT0 to MTn−1 in the same block BLK are coupled commonly to word lines WL0 to WLn−1.

Second terminals of the selection transistors ST1 in the NAND string 35 that are present in the same column in the memory cell array 11A are coupled commonly to any one of the bit lines BL (BL0 to BLm−1). Namely, a bit line BL commonly couples the NAND string 35 between the plurality of blocks BLK. Furthermore, second terminals of the plurality of selection transistors are coupled commonly to a source line SL.

Namely, the string unit SU is an aggregate of NAND strings 35 coupled to different bit lines BL and coupled to the same selection gate line SGD. The block BLK is an aggregate of a plurality of string units SU coupling word lines WL in common. The memory cell array 11A is an aggregate of a plurality of blocks BLK coupling bit lines BL in common.

In a memory cell MT coupled to any of the word lines WL in the string unit SU, data writing and data reading are performed in a collective manner. This unit is called a page. In writing and reading, the blocks BLK are divided into units of pages (page 0, page 1 . . . ).

On the other hand, data erasing can be performed in a block BLK unit or a unit smaller than the block BLK unit. The data erasing method is described, for example, in U.S. patent application Ser. No. 13/235,389 filed on Sep. 18, 2011 and titled "NONVOLATILE SEMICONDUCTOR MEMORY DEVICE", and is described in U.S. patent application Ser. No. 12/694,690 filed on Jan. 27, 2010 and titled "NON-VOLATILE SEMICONDUCTOR STORAGE DEVICE". Furthermore, the data erasing method is described in U.S. patent application Ser. No. 13/483,610 filed on May 30, 2012 and titled "NONVOLATILE SEMICONDUCTOR MEMORY DEVICE AND DATA ERASE METHOD THEREOF". These patent applications are provided and disclosed as a whole for reference in the specification of the present application.

FIG. 4 is a cross-sectional view showing a block BLK in the semiconductor memory device 100 according to the embodiment.

As shown in FIG. 4, a plurality of NAND strings 35 are provided on a P-well region (semiconductor substrate) 20. That is, on the well region 20, for example, four layers of interconnection layer 21 each functioning as a selection gate line SGS, n layers of interconnection layer 22 each functioning as a word line WL (WL0 to WLn−1), and for example, four layers of interconnection layer 23 each functioning as a selection gate line SGD are stacked in a sequential order. An unillustrated insulation layer is formed between the respectively stacked interconnection layers.

A pillar-shaped conductor 24 that passes through these interconnection layers 21, 22, and 23 and reaches the well region 20 is provided. On a side surface of the conductor 24, a gate insulation layer 25, a charge storage layer (insulation layer or conductive layer) 26, and a block insulation layer 27 are provided in a sequential order. The conductor 24, gate insulation layer 25, charge storage layer 26, and block insulation layer 27 constitute the memory cell transistor MT and the selection transistors ST1 and ST2. The conductor 24 functions as a current path of the NAND strings 35, resulting in a region where channels of each transistor are formed. The conductor 24 is coupled at its upper end to a metal interconnection layer 28 that functions as a bit line BL.

Within a surface area of the well region 20, an n$^+$ impurity-diffusion layer 29 is provided. On the impurity-diffusion layer 29, a contact plug 30 is provided. The contact plug 30 is coupled to the metal interconnection layer 31 that functions as a source line SL. Within the surface area of the well region 20, a p$^+$ impurity-diffusion layer 32 is further provided. On the impurity-diffusion layer 32, a contact plug 33 is provided. The contact plug 33 is coupled to the metal interconnection layer 34 that functions as a well-interconnection CPWELL. The well-interconnection CPWELL is an interconnection to apply a potential to the conductor 24 via the well region 20.

The configuration described above is arranged in the plural in a depth direction of the plane of paper illustrating FIG. 4. The string unit SU is composed of an aggregate of a plurality of NAND strings 35 arranged in the depth direction.

Furthermore, the configuration of the memory cell array 11A may be a different configuration. Namely, the configuration of the memory cell array 11A is described, for example, in U.S. patent application Ser. No. 12/407,403 filed on Mar. 19, 2009 and titled "THREE DIMENSIONAL STACKED NONVOLATILE SEMICONDUCTOR MEMORY", and is described in U.S. patent application Ser. No. 12/406,524 filed on Mar. 18, 2009 and titled "THREE DIMENSIONAL STACKED NONVOLATILE SEMICONDUCTOR MEMORY", and U.S. patent application Ser. No. 12/679,991 filed on Mar. 25, 2010 and titled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and titled "SEMICONDUCTOR MEMORY AND METHOD FOR MANUFACTURING SAME". These patent applications are provided and disclosed as a whole for reference in the specification of the present application.

2. Operation in Embodiment (2-1. Flowchart of Writing in Test Mode in Embodiment)

In this embodiment, in writing in a test mode, writing (a program and a verify) is performed in parallel (concurrently) on pages of a plurality of blocks BLK. At that time, the program is performed for the plurality of blocks BLK, and the verify is performed only for a singular block BLK of the plurality of blocks BLK. The following are detailed descriptions on writing in a test mode.

A program is an operation to increase a threshold level of a memory cell by injecting electrons to a charge storage layer (or to maintain the threshold level by inhibiting the injection). A verify is an operation to determine whether or not the threshold level of a memory cell reaches a predetermined level by reading data after the program. In the writing, the threshold level of a memory cell is increased to the predetermined level by looping (repeating) a combination of a verify and a program.

Figure 5:
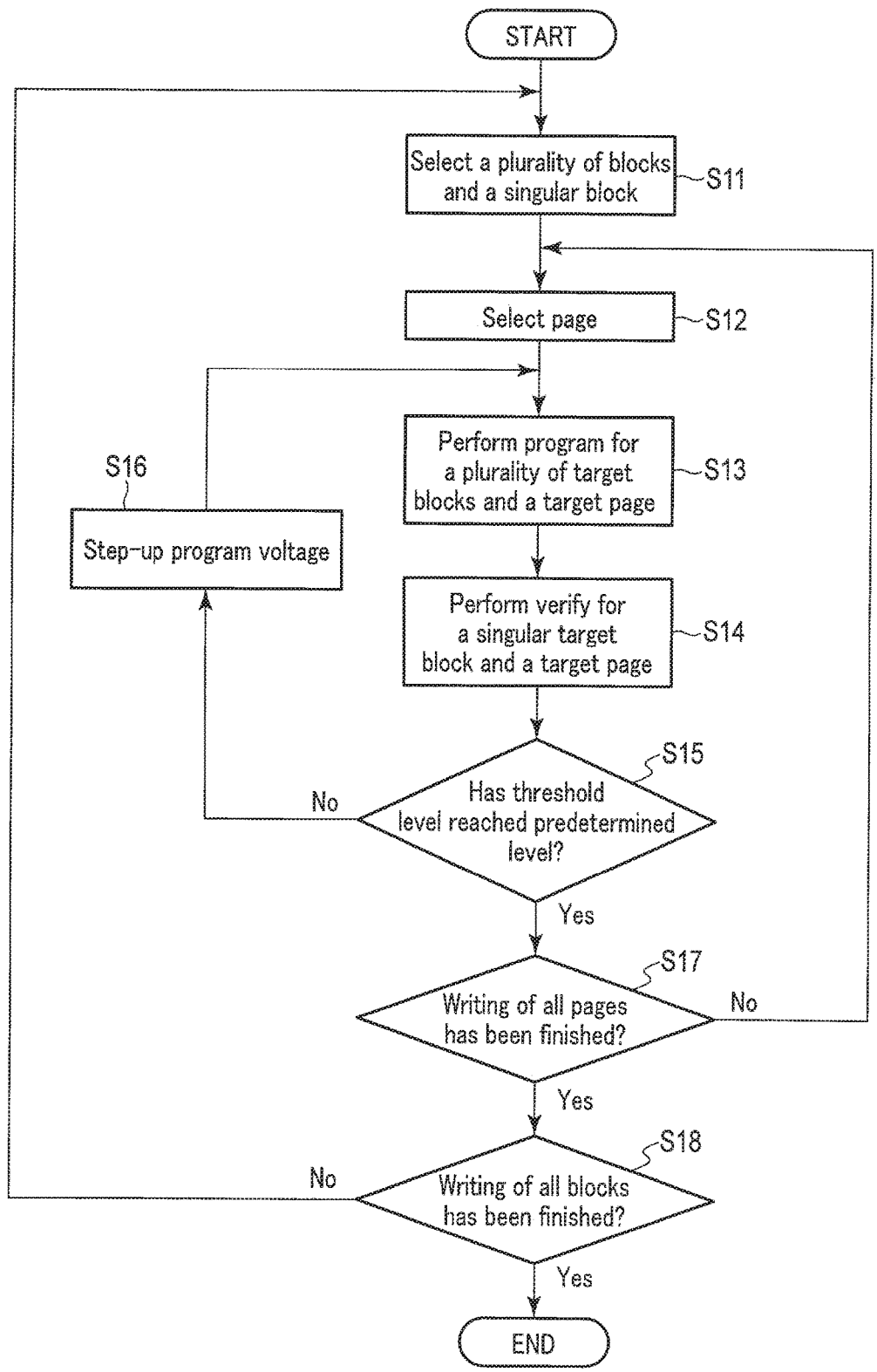
FIG. 5 is a flowchart showing writing in a test mode in the semiconductor memory device according to the embodiment.

FIG. 5 is a flowchart showing writing in a test mode in the semiconductor memory device 100 according to the present embodiment.

As shown in FIG. 5, in writing in a test mode, first, in step S11, a row decoder 12 (multi-block selection circuit 41) selects a plurality of discretionary blocks BLK and a singular discretionary block BLK of the plurality of discretionary blocks BLK. For example, the row decoder 12 selects, as the plurality of blocks BLK, blocks BLK1 and BLK2, and selects, as the singular block BLK, a block BLK2, based on a received block address. The selected plurality of blocks BLK are targeted for a program, and the selected singular block BLK is targeted for a verify.

In the embodiment, two blocks BLK are selected as the plurality of blocks BLK; however, the embodiment is not limited thereto, and three or more blocks BLK may be selected. In this case, a discretionary singular block BLK of the three or more blocks BLK is selected. As the singular block BLK, it is desired to select a highly reliable block BLK other than the edges (a nearest block BLK from the sense amplifier 13 or a farthest block therefrom).

Next, in step S12, the row decoder 12 selects a page of each of the selected blocks BLK. For example, the row decoder 12 selects pages 0 of block BLK1 and BLK2, based on a received page address.

Next, in step S13, the sequencer 18 performs a program on the target pages of the plurality of selected blocks BLK in parallel. Namely, the sequencer 18 performs a program on the page 0 of the block BLK1 and on the page 0 of the block BLK2 in parallel (Loop 1).

Next, in step S14, the sequencer 18 performs a verify on a target page of the selected singular target block BLK. Namely, the sequencer 18 performs a verify on a target page of the selected singular block BLK. On the other hand, no verify is performed on the page 0 of the block BLK1 (Loop 1).

Next, in step S15, whether or not the threshold level of the memory cell of the target page reaches a predetermined level is determined based on the verify result.

If the threshold level of the memory cell has not yet reached the predetermined level in step S15, a program voltage is stepped up in step S16. In step S13, a program is performed on the target pages (pages 0) of the plurality of target blocks BLK (blocks BLK1 and BLK2) by the stepped up program voltage (Loop 2).

If the threshold level of the memory cell has reached the predetermined level in step S15, whether or not writing of all pages in the plurality of target blocks BLK has been finished is determined in step S17.

If the writing of all pages has not yet been finished in step S17, the next page is selected (incremented) in step S12. For example, the row decoder 12 selects pages 1 of the blocks BLK1 and BLK2 based on a received page address.

If the writing of all pages has been finished in step S17, whether or not writing of all blocks BLK has been finished is determined in step S18.

If the writing of all pages has not yet been finished in step S18, a next discretionary plurality of blocks BLK and a discretionary singular block BLK of the plurality of blocks are selected in step S11. For example, the row decoder 12 selects blocks BLK3 and BLK4 as a plurality of blocks, and selects a block BLK3 as a singular block BLK, based on a received block address.

When the writing of all blocks BLK has been finished in step S18, the writing in the test mode is finished.

(2-2. Command Sequence of Writing in Test Mode in Embodiment)

As described above, in writing in a test mode, a program is performed for a plurality of blocks BLK, and a verify is performed for a singular block BLK of the plurality of blocks BLK. Such selections of a plurality of blocks BLK targeted for a program and a singular block BLK targeted for a verify are executed by receiving a particular command. Hereinafter, a particular command sequence will be explained in detail.

Figure 7:
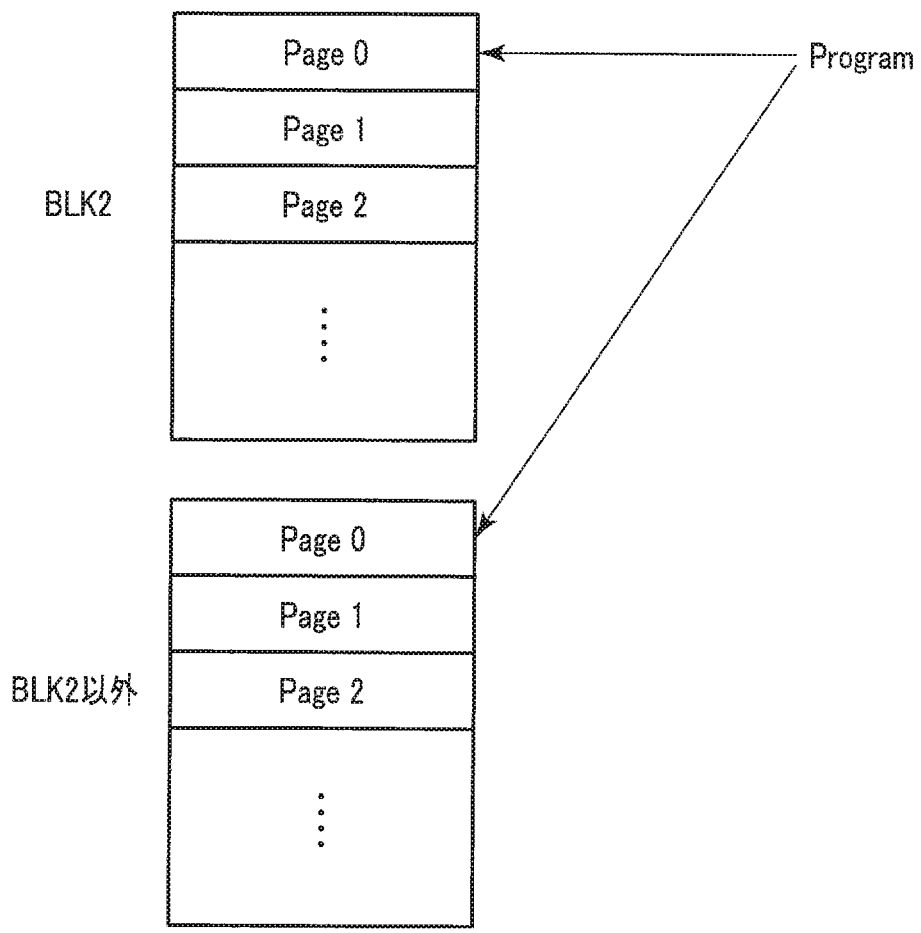
FIG. 7 is a schematic diagram showing writing in a test mode in the semiconductor memory device according to the embodiment.
Figure 8:
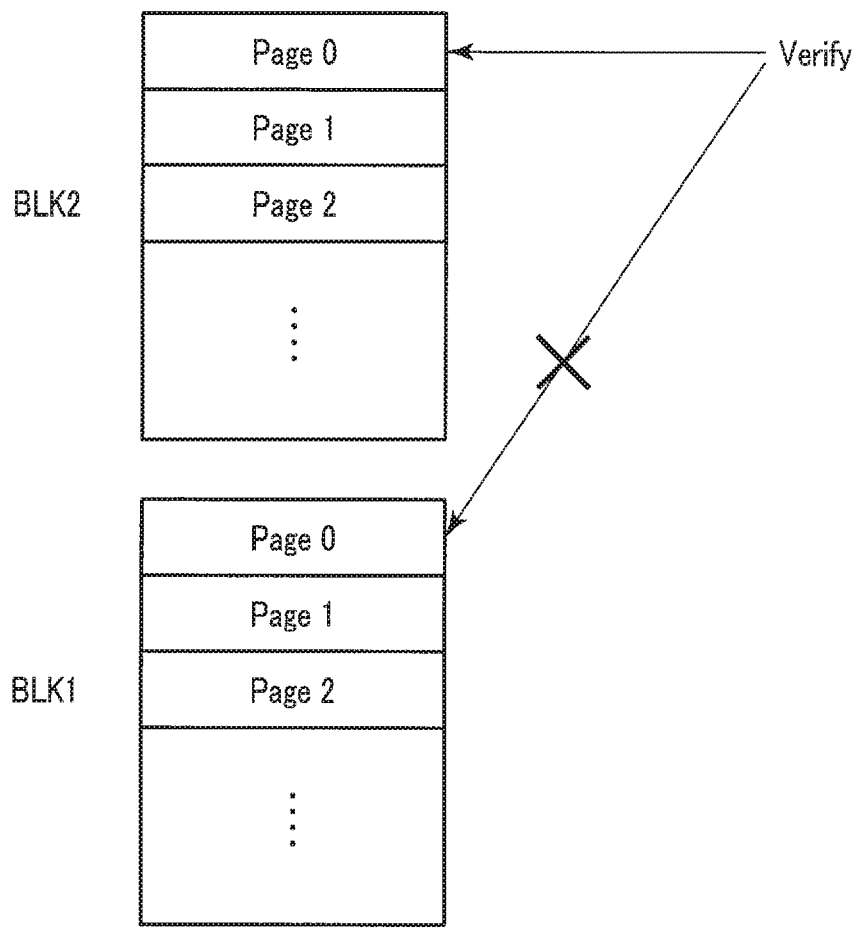
FIG. 8 is a schematic diagram showing the writing in a test mode in the semiconductor memory device according to the embodiment.

FIG. 6 is a diagram showing a command sequence of writing in a test mode in the semiconductor memory device 100 according to the embodiment. In the embodiment, an example is provided where pages 0 of blocks BLK1 and BLK2 are selected. FIGS. 7 and 8 are each a schematic diagram showing writing in a test mode in the semiconductor memory device 100 according to the embodiment.

In the following explanations, a command and an address are issued at the outside (a memory controller), and are received by the semiconductor memory device 100.

As shown in FIG. 6, first, the semiconductor memory device 100 receives a command xxh. The command xxh is a particular command, and a command for giving an instruction to perform writing in the above-mentioned test mode. The command xxh is a command to set a program target of writing in the test mode to a plurality of blocks BLK, and set a verify target to a singular block BLK.

Next, the semiconductor memory device 100 receives an address ADD1. The address ADD1 designates an address that performs writing in a test mode and designates a block address. Specifically, the address ADD1 designates a plurality of block addresses to be subjected to a program for writing in a test mode and a singular block address to be subjected to a verify. In the embodiment, the address ADD1 designates addresses of blocks BLK1 and BLK2 as the program targets, and designates an address of block BLK2 as a verify target.

By the command xxh and the address ADD1, writing in a test mode is set. Namely, writing is set so that a program is performed for the blocks BLK1 and BLK2 in parallel, and subsequently, a verify is performed for the block BLK2.

Next, the semiconductor memory device 100 receives a normal command and normal address related to the writing operation. Specifically, first, the semiconductor memory device 100 receives a command 80h. The command 80h is a command for giving an instruction to input an address in the writing. The semiconductor memory device 100 successively receives an address ADD2. The address ADD2 designates an address to perform writing in a test mode, and designates a page address (row address, word line WL). In the embodiment, the address ADD2 designates a page 0 of each block BLK. Subsequently, the semiconductor memory device 100 receives a command 10h. The command 10h is a command for giving an instruction to perform writing.

The semiconductor memory device 100 comes into a busy state (RB="L (Low)" level) in response to the command 10h to start writing. As illustrated in the figure, the writing includes a program and a verify, and the program and verify are performed in a looped (repeated) manner until the threshold level of the memory cell has exceeded a predetermined level.

Specifically, first, in a period of time from time T1 to time T2, a program of Loop 1 is performed. This program is performed for the page 0 of the block BLK1 and the page 0 of the block BLK2 in parallel as shown in FIG. 7. Subsequently, in a period of time from time T2 to time T3, the verify in Loop 1 is performed. This verify is performed only for the page 0 of the block BLK2 as shown in FIG. 8.

Next, in a period of time from time T3 to time T4, a program of Loop 2 is performed. In the program of Loop 2, a program voltage is stepped up. The program of Loop 2 is performed for the page 0 of the block BLK1 and the page 0 of the block BLK2 in parallel as with Loop 1. Subsequently, in a period of time from time T4 to time T5, a verify of Loop 2 is performed. The verify of Loop 2 is performed for only the page 0 of the block BLK2.

Thereafter, the program and verify are repeatedly performed until the threshold level of the memory cell has reached a predetermined level.

Though not illustrated, when the writing to the pages 0 of the block BLK1 and BLK2 is finished, the commands 80h and 10h, and an address ADD2 are issued. The address ADD2 designates, for example, page 1. With this configuration, for example, writing to pages 1 of the block BLK1 and BLK2 is performed.

When writing to all pages of the block BLK1 and BLK2 is finished, the command xxh, 10h, and an address ADD1 are issued. The address ADD1 designates, for example, blocks BLK3 and BLK4 as a plurality of blocks BLK, and designates a BLK3 as a singular block. Furthermore, the commands 80h and 10h and an address ADD2 are issued. The address ADD2 designates, for example, page 0. With this configuration, writing, for example, to pages 0 of the blocks BLK3 and BLK4 is performed.

(2-3. Voltage Timing Chart of Writing in a Test Mode in Embodiment)

Hereinafter, a voltage timing charge in the writing in the test mode described above will be explained.

Figure 9:
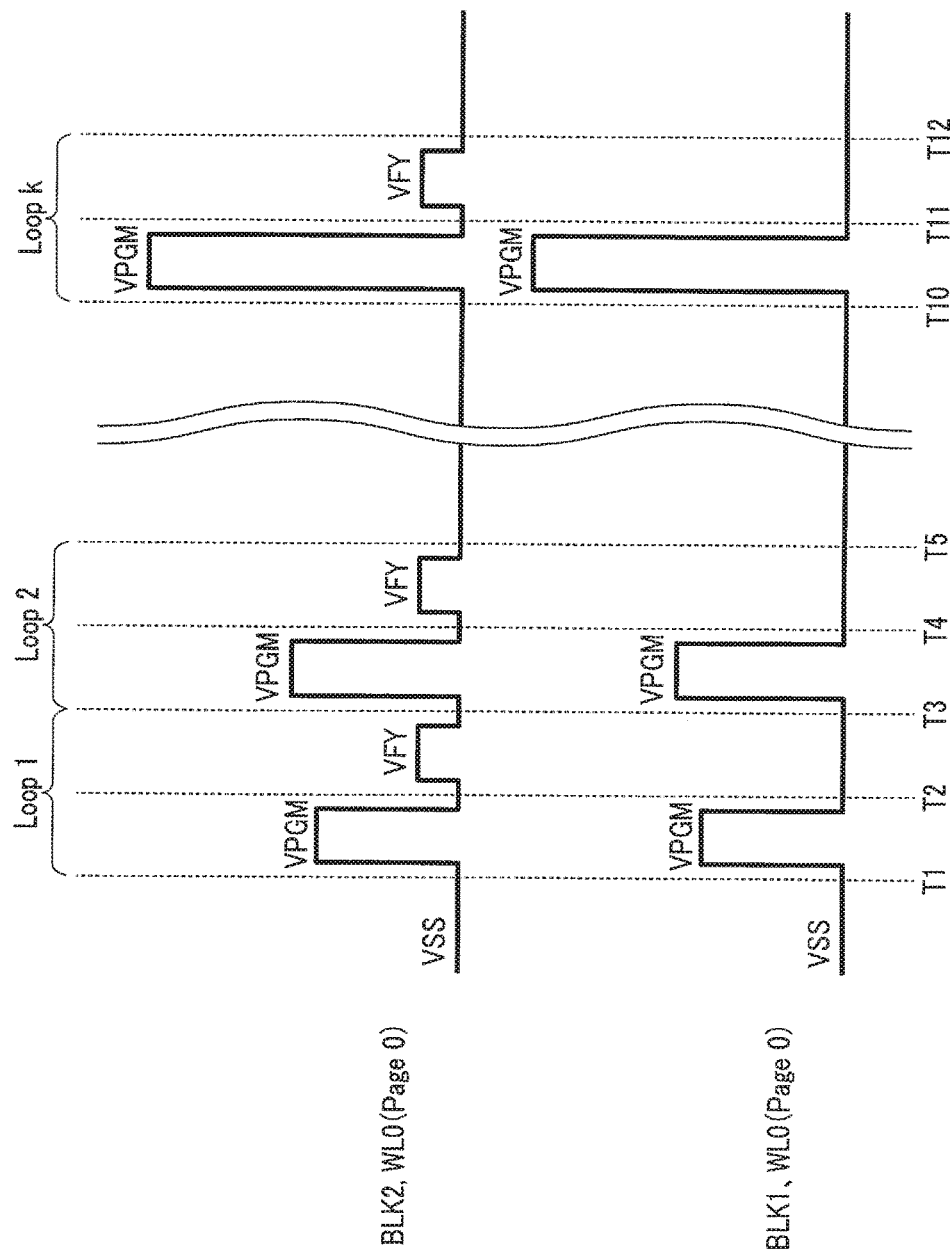
FIG. 9 is a voltage timing chart showing writing in a test mode in the semiconductor memory device according to the embodiment.

FIG. 9 is a voltage timing chart showing writing in a test mode in the semiconductor device 100 according to the embodiment. In the embodiment, an example is provided where pages 0 of blocks BLK1 and BLK2 are selected, and the figure shows a voltage applied to a word line WL.

As shown in FIG. 9, in the writing operation, a combination of a program and a verify is performed in Loop 1 to Loop k.

Specifically, first, in a period of time from time T1 to time T2, a program of Loop 1 is performed. On this occasion, a program voltage VPGM is applied to a word line WL0 of (a word line WL corresponding to page 0) of the block BLK1 and a word line WL0 of the block BLK2. Namely, a program is performed for page 0 of the block BLK1 and page 0 of the block BLK2.

Thereafter, a verify of Loop 1 is performed in a period of time from a time T2 to a time T3. At this time, a verify voltage VFY is applied to the word line WL0 of the block BLK2. On the other hand, a voltage VSS is applied to a word line WL of the block BLK1. Namely, a verify is performed for page 0 of the block BLK2, and no verify is performed for page 0 of the block BLK1.

For example, when a memory cell stores 3-bit data, voltages VFYA, VFYB, VFYC, VFYD, VFYE, VFYF, and VFYG are applied in this order as verify voltages VFY (VFYA<VFYB<VFYC<VFYD<VFYE<VFYF<VFYG).

Next, in the period of time from time T3 to time T4, a program of Loop 2 is performed. At this time, a stepped up program VPGM is applied to a word line WL0 of the block BLK1 and a word line WL0 of the block BLK2. Namely, a program is performed again for the page 0 of the block BLK1 and the page 0 of the block BLK2.

Thereafter, after a ground voltage VSS is applied thereto, a verify of Loop 2 is performed in a period of time from time T4 to time T5. At that time, the verify voltage VFY is applied to the word line WL0 of the block BLK2 as with Loop 1. The voltage VSS is applied to the word line WL0 as with Loop 1. Namely, the verify is performed again for the page 0 of the block BLK2, and no verify is performed for the page 0 of the block BLK1 as with Loop 1.

Thereafter, in Loop 3 to Loop k−1 (time T5 to time T10) and the final Loop k (time T10 to time T12), the program is performed again for the page 0 of the block BLK1 and the page 0 of the block BLK2 by the voltages VPGM that are stepped up in sequence, and the verify is performed again for only the page 0 of the block BLK2 by the verify voltages VFY as with Loop 2.

Effect in Embodiment

In an NAND flash memory, writing (a program and a verify) in a test mode is performed before shipment thereof. The writing in a test mode is performed sequentially for all memory cells of the NAND flash memory. Specifically, writing is performed for one block on a page basis, and then writing is performed sequentially for the next block on a page basis (normal writing). The operations are repeatedly performed sequentially to the final block on a page basis. In such normal writing, a test time takes much longer along with increased capacities of NAND flash memories. The longer test time leads to an increase in production costs of NAND flash memories.

In contrast, according to the embodiment described above, a multi-block selection circuit 41 is provided. The multi-block selection circuit 41 selects, in writing in a test mode, a plurality of blocks BLK. Then, in the writing in a test mode, writing is performed in parallel (concurrently) on pages of the plurality of selected blocks BLK (particular writing). For example, writing on page 0 of the block BLK1 is performed in parallel with writing on page 0 of the block BLK2. Such writing enables shortening the writing time in a test mode.

On the other hand, in writing of a NAND flash memory, the consumption current of a verify is greater than the consumption current of a program. For this reason, if a verify is performed concurrently in a plurality of blocks BLK, a large current flows in the semiconductor memory device, and this may cause a problem in a test operation.

In contrast, according to the embodiment described above, when writing is performed in parallel on pages of a plurality of blocks BLK, a program is performed for a plurality of discretionary blocks, and a verify is performed only for a singular discretionary block of the plurality of discretionary blocks. For example, a program for page 0 of block BLK1 is performed in parallel with a program for page 0 of block BLK2, and then only a verify for page 0 of the block BLK2 is performed. This configuration enables suppression of a large current in a verify, making it possible to perform a test operation without any problem.

In the test mode of the present embodiment, not only a particular writing but also a normal writing may be performed. With this configuration, the reliability in a test mode can be improved. As described above, the particular writing is executed by the issuance of a particular command xxh and a normal command 80h. On the other hand, the normal writing is performed by the issuance of the normal command 80h.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell array including a first block, a second block, and a third block, the first block including a first memory cell, the second block including a second memory cell, and the third block including a third memory cell;
a multi block selection circuit configured to, in writing, select the first block, the second block, and the third block, and to select a specific block from among the selected first, second, and third blocks; and
a controller that performs, in a first period of time in the writing, a first program in the first memory cell, the second memory cell, and the third memory cell,
wherein the controller performs, in a second period of time after the first period of time, a first verify in the first memory cell, and
wherein the specific block is a block other than a block nearest to a sense amplifier and a block farthest from the sense amplifier.

2. The device of claim 1, wherein the controller performs, in a third period of time after the second period of time, a second program in the first memory cell and the second memory cell.

3. The device of claim 2, wherein the controller performs, in a fourth period of time after the third period of time, a second verify in the first memory cell.

4. The device of claim 1, wherein the controller performs the first program when the controller receives a first command and a second command different from the first command.

5. A semiconductor memory device comprising:
a first memory cell array including a first block, a second block, and a third block, the first block including a first memory cell, the second block including a second memory cell, and the third block including a third memory cell;
a first word line coupled to the first memory cell;
a second word line coupled to the second memory cell;
a third word line coupled to the third memory cell;
a multi block selection circuit configured to, in writing, select the first block, the second block, and the third block, and to select a specific block from among the selected first, second, and third blocks; and
a controller that applies a first voltage to the first word line, the second word line, and the third word line, in a first period of time in the writing,
wherein the controller applies a second voltage to the first word line, and applies a third voltage smaller than the second voltage to the second word line and the third word line, in a second period of time after the first period of time, and
wherein the specific block is a block other than a block nearest to a sense amplifier and a block farthest from the sense amplifier.

6. The device of claim 5, wherein the controller applies a fourth voltage larger than the first voltage to the first word line and the second word line in a third period of time after the second period of time.

7. The device of claim 6, wherein the controller applies the second voltage to the first word line, and applies the third voltage to the second word line, in a fourth period of time after the third period of time.

8. The device of claim 5, wherein the controller applies the first voltage to the first word line and the second word line when the controller receives a first command and a second command different from the first command.

* * * * *